US006818531B1

United States Patent
Yoo et al.

(12) United States Patent
(10) Patent No.: US 6,818,531 B1
(45) Date of Patent: Nov. 16, 2004

(54) METHOD FOR MANUFACTURING VERTICAL GAN LIGHT EMITTING DIODES

(75) Inventors: Seung Jin Yoo, Kyungki-do (KR); In Eung Kim, Kyungki-do (KR); Hun Joo Hahm, Kyungki-do (KR); Young Ho Park, Kyungki-do (KR); Jeong Seok Na, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/611,898

(22) Filed: Jul. 3, 2003

(30) Foreign Application Priority Data

Jun. 3, 2003 (KR) ................................. 10-2003-0035766

(51) Int. Cl.[7] ........................... H01L 21/30; H01L 21/46
(52) U.S. Cl. ....................... 438/458; 438/113; 438/455; 438/460; 438/462; 438/977
(58) Field of Search ................................. 438/113, 114, 438/453, 455, 457–460, 462, 464, 977

(56) References Cited

U.S. PATENT DOCUMENTS

| | | | | |
|---|---|---|---|---|
| 5,557,115 A | * | 9/1996 | Shakuda | 257/81 |
| 5,994,205 A | * | 11/1999 | Yamamoto et al. | 438/464 |
| 6,100,104 A | * | 8/2000 | Haerle | 438/33 |
| 6,559,075 B1 | * | 5/2003 | Kelly et al. | 438/795 |
| 6,562,701 B2 | * | 5/2003 | Ishida et al. | 438/479 |
| 6,656,820 B2 | * | 12/2003 | Liu | 438/460 |
| 2002/0182839 A1 | * | 12/2002 | Ogawa et al. | 438/604 |

* cited by examiner

Primary Examiner—Kamand Cuneo
Assistant Examiner—Asok Kumar Sarkar
(74) Attorney, Agent, or Firm—Lowe, Hauptman, Gilman & Berner, LLP

(57) ABSTRACT

A method for manufacturing vertical GaN light emitting diodes starts by forming a light emitting structure on a sapphire substrate, said light emitting structure including a first conductive GaN clad layer, an active layer and a second conductive GaN clad layer. The light emitting structure is divided into plural units so that the first conductive GaN clad layer of a thickness of at least approximately 100 Å remains. A conductive substrate is attached to the divided upper surface of the light emitting structures using a conductive adhesive layer. A lower surface of the sapphire substrate is irradiated by laser beam so that the sapphire substrate is removed from the unit light emitting structures. First and second contacts are formed respectively on the surfaces of the first conductive clad layer and the conductive substrate. Finally, the resulting structure is cut into plural unit light emitting diodes.

10 Claims, 3 Drawing Sheets

(a)

(b)

(c)

(d)

(e)

(f)

METHOD FOR MANUFACTURING VERTICAL GAN LIGHT EMITTING DIODES

BACKGROUND OF THE INVENTION

1. Field of the Invention

The present invention relates to a method for manufacturing vertical GaN light emitting diodes, and more particularly to a method for manufacturing vertical GaN light emitting diodes, from which an insulating sapphire substrate with low thermal conductivity is removed and in which a conductive substrate such as a silicon substrate is installed so as to have improved luminance and reliability.

2. Description of the Related Art

Generally, light emitting diodes (LEDs) are semiconductor elements, which emit light based on the recoupling of electrons and holes, and are widely used as various types of light sources in optical communication and electronic equipment. GaN serves as a compound for manufacturing blue-light emitting diodes.

Frequency (or wavelength) of light emitted from the light emitting diode is functionally related to a band gap of a semiconductor material to be used. When the band gap is small, photons with low energy and a longer wavelength are generated. In order to generate photons with a shorter wavelength, there is required a semiconductor material with a broader band gap.

For example, AlGaInP commonly used in lasers emits light corresponding to visible red light (approximately 600~700 nm). On the other hand, silicon carbide (SiC) and Group III nitride semiconductor materials such as gallium nitride (GaN) with a comparatively broad band gap emit light corresponding to visible blue light or ultraviolet rays. A short wavelength LED has an advantage in increasing a storage space of an optical storage (approximately 4 times as large as that of a general LED emitting red light).

The same as other Group III nitride semiconductor materials for emitting blue light, there is no practical technique for forming a bulk single crystal made of GaN. Accordingly, there is required a substrate suitable for growing a GaN crystal thereon. Sapphire, i.e., aluminum oxide ($Al_2O_3$), is typically used as such a substrate for growing the GaN crystal thereon.

However, a sapphire substrate has an insulating property, thus limiting the structure of a GaN light emitting diode. With reference to FIG. 1, the structure of a conventional GaN light emitting diode is will be described in detail.

FIG. 1 is a cross-sectional view of a conventional GaN light emitting diode 10. The GaN light emitting diode 10 comprises a sapphire substrate 11 and a GaN light emitting structure 15 formed on the sapphire substrate 11.

The GaN light emitting structure 15 includes an n-type GaN clad layer 15a, an active layer 15b formed to have a multi-quantum well structure, and a p-type. GaN clad layer 15c. Here, the n-type GaN clad layer 15a, the active layer 15b and the p-type GaN clad layer 15c are sequentially formed on the sapphire substrate 11. The light emitting structure 15 may be grown on the sapphire substrate 11 using MOCVD (metal-organic chemical vapor deposition), etc. Here, in order to improve the lattice matching of the light emitting structure 15 and the sapphire substrate 11, a buffer layer (not shown) made of AlN/GaN may be formed on the sapphire substrate 11 before the growing of the n-type GaN clad layer 15a.

The p-type GaN clad layer 15c and the active layer 15b are removed at designated portions by dry etching so as to selectively expose the upper surface of the n-type GaN clad layer 15a. An n-type contact 19 is formed on the exposed upper surface of the n-type GaN clad layer 15a, and a p-type. contact 17 is formed on the upper surface of the p-type GaN clad layer 15c. A designated voltage is applied to the n-type contact 19 and the p-type contact 17. Generally, in order to increase a current injection area while not negatively affecting luminance, a transparent electrode 16 may be formed on the upper surface of the p-type GaN clad layer 15c before forming the p-type contact 17 on the p-type GaN clad layer 15c.

As described above, since the conventional GaN light emitting diode 10 uses the insulating sapphire substrate 11, the two contacts 17 and 19 are formed on the sapphire substrate so that the contacts 17 and 19 are nearly horizontal with each other. Accordingly, when a voltage is applied to the conventional GaN light emitting diode 10, a current flows over a narrow area from the n-type contact 19 to the p-type contact 17 via the active layer 15b in a horizontal direction. Since a forward voltage ($V_f$) of the light emitting diode 10 is increased due to this narrow current flow, the current efficiency of the light emitting diode 10 is lowered and an electrostatic discharge effect is weak.

Further, the conventional GaN light emitting diode 10 emits a great amount of heat in proportion to the increase of the current density. On the other hand, the sapphire substrate 11 has low thermal conductivity, thus not rapidly dissipating heat. Accordingly, mechanical stress is exerted between the sapphire substrate 11 and the GaN light emitting structure 15 due to the increased temperature, thus causing the GaN light emitting diode 10 to be unstable.

Moreover, in order to form the n-type contact 19, a portion of the active layer 15b with a size at least larger than that of the contact 19 to be formed must be removed. Accordingly, a tight emitting area is reduced, and the luminous efficiency according to the luminance relative to the size of the diode 10 is lowered.

In order to solve this problem, there is required a vertical light emitting diode. A method for manufacturing the vertical light emitting diode must comprise a step of removing a sapphire substrate from a GaN light emitting structure so as to form a contact layer on upper and lower surfaces of the vertical light emitting diode.

The sapphire substrate may be removed from the GaN light emitting structure using several conventional techniques. Since the sapphire substrate has a high strength, there is a limit to the ability to remove the sapphire substrate from the GaN light emitting structure using mechanical polishing. Further, the removal of the sapphire substrate from the GaN light emitting structure using a laser beam may cause damage to the GaN single crystal plane of the GaN light emitting structure due to the lattice mismatching and the difference of thermal coefficient of expansion (TCE) between the sapphire substrate and the light emitting structure during exposure to the laser beam.

More specifically, when the laser beam is irradiated on the lower surface of the sapphire substrate in order to remove the sapphire substrate from a GaN single crystalline layer, residual stress occurs due to the difference of thermal coefficient of expansion between the sapphire substrate and the GaN single crystalline layer, and the lattice mismatching thereof. That is, the thermal coefficient of expansion of sapphire is approximately $7.5 \times 10^{-6}$/K, while the thermal coefficient of expansion of GaN single crystal is approximately $5.9 \times 10^{-6}$/K. In this case, the rate of the lattice mismatching is approximately 16%. In case that a GAN/AlN buffer layer is formed on the sapphire substrate prior to the growing of the GaN single crystalline layer, the rate of the lattice mismatching is several percent (%). Accordingly, when the heat is generated by exposure to the laser beam, large-sized compressive stress is exerted on the surface of the sapphire substrate and large-sized tensile stress is exerted on the surface of the GaN single crystalline layer. Particularly, since the area of the irradiation of the laser beam is narrow (maximally 10 mm×10 mm), the laser beam is repeatedly irradiated on sectional areas of the sapphire substrate so that the laser beam can be irradiated on the entire surface of the sapphire substrate. Thereby, the level of stress becomes more serious, thus excessively damaging the surface of the GaN single crystalline layer.

As a result, the damaged GaN single crystalline plane drastically reduces the electric characteristics of the finally manufactured GaN light emitting diode.

SUMMARY OF THE INVENTION

Therefore, the present invention has been made in view of the above problems, and it is an object of the present invention to provide a method for manufacturing GaN blue light emitting diodes with improved luminance and reliability obtained by stably removing a sapphire substrate from a GaN light-emitting structure.

In accordance with the present invention, the above, and other objects can be accomplished by the provision of a method for manufacturing GaN light emitting diodes, comprising the steps of: (a) forming a light emitting structure on a sapphire substrate, said light emitting structure including a first conductive GaN clad layer, an active layer and a second conductive GaN clad layer sequentially stacked on the sapphire substrate; (b) dividing the light emitting structure into plural units with a designated size so that the first conductive GaN clad layer of a thickness of at least approximately 100 Å remains; (c) attaching a conductive substrate to exposed upper surfaces of the unit light emitting structures using a conductive adhesive layer; (d) irradiating a laser beam on a lower surface of the sapphire substrate so that the sapphire substrate is removed from the unit light emitting structures, wherein the residual first conductive GaN clad layer is removed so that the light emitting structure is perfectly divided into the unit light emitting structures with a size the same as that of light emitting diodes to be finally manufactured; (e) forming first and second contacts respectively on the surface of the first conductive clad layer, from which the sapphire substrate is removed, and the exposed surface of the conductive substrate; and (f) cutting the resulting structure along the divided lines of the unit light emitting structures into plural unit light emitting diodes.

In the step (b), the thickness, of the residual first conductive GaN clad layer may be preferably less than approximately 2 $\mu$m, and more preferably less than approximately 1 $\mu$m.

Further, in order to improve the luminance of light emitted from the upper surface of the diode, a reflective layer made of a conductive material may be formed between the second conductive GaN clad layer and the conductive adhesive layer. Preferably, the reflective layer may be made of a material selected from the group consisting of Au, Ni, Ag, Al and their alloys.

Preferably, the conductive substrate may be made of a material selected from the group consisting of silicon (Si), germanium (Ge), SiC, ZnO, diamond, and GaAs, and the conductive adhesive layer may be made of a material selected from the group consisting of Au—Sn; Sn, In, Au—Ag, Ag—In, Ag—Ge, Ag—Cu and Pb—Sn.

Further, in order to obtain an improved current density distribution, the first conductive GaN clad layer may be a GaN crystalline layer doped with an n-type impurity, and the second conductive GaN clad layer may be a GaN crystalline layer doped with a p-type impurity.

Moreover, preferably, in the step (c), the conductive adhesive layer may be formed on the lower surface of the conductive substrate in advance, and then the lower surface of the conductive substrate provided with the conductive adhesive layer may be attached to the exposed upper surfaces of the unit light emitting structures. Alternatively, in the step (c), the conductive adhesive layer may be formed on the upper surfaces of the unit light emitting structures, and then the conductive substrate may be attached to the upper surfaces of the unit light emitting structures provided with the conductive adhesive layer.

In the method for manufacturing vertical GaN Light emitting diodes of the present invention, the GaN single crystalline light emitting structure is grown on the sapphire substrate and the conductive substrate such as a silicon substrate is attached to the other surface of the light emitting structure using the conductive adhesive layer. Subsequently, the sapphire substrate is removed from the light emitting structure using the laser beam. Accordingly, it is possible to more easily manufacture the vertical GaN Light emitting diodes.

Further, in the method for manufacturing vertical GaN Light emitting diodes of the present invention, the light emitting structure is divided into plural units with a designated size so that the first conductive GaN clad layer of a thickness of at least, approximately 100 Å remains on the sapphire substrate. Accordingly, it is possible to prevent the laser beam passing through the sapphire substrate from reaching and melting the conductive adhesive layer, during the step of removing the sapphire substrate from the light emitting structure using the laser beam.

Here, the residual first conductive GaN clad layer may be removed by mechanical impact indispensably generated when the laser beam is irradiated on the sapphire substrate so as to remove sapphire substrate from the light emitting structure. The thickness of the residual first conductive GaN clad layer may be preferably less than approximately 2 $\mu$m, and more preferably less than approximately 1 $\mu$m, so that the residual first conductive GaN clad layer can be removed by small mechanical impact.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 1:
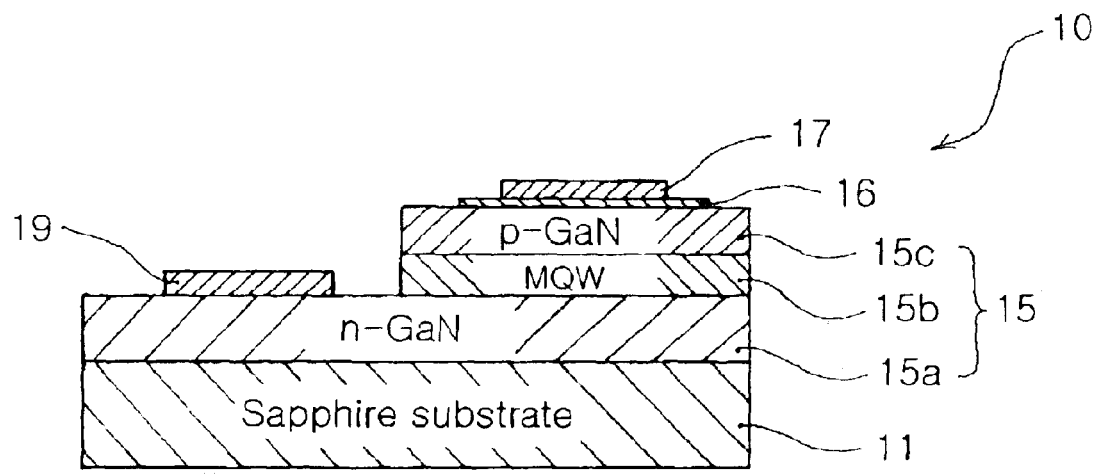
FIG. 1 is a schematic cross-sectional view of a conventional GaN light emitting diode.
Figure 2:
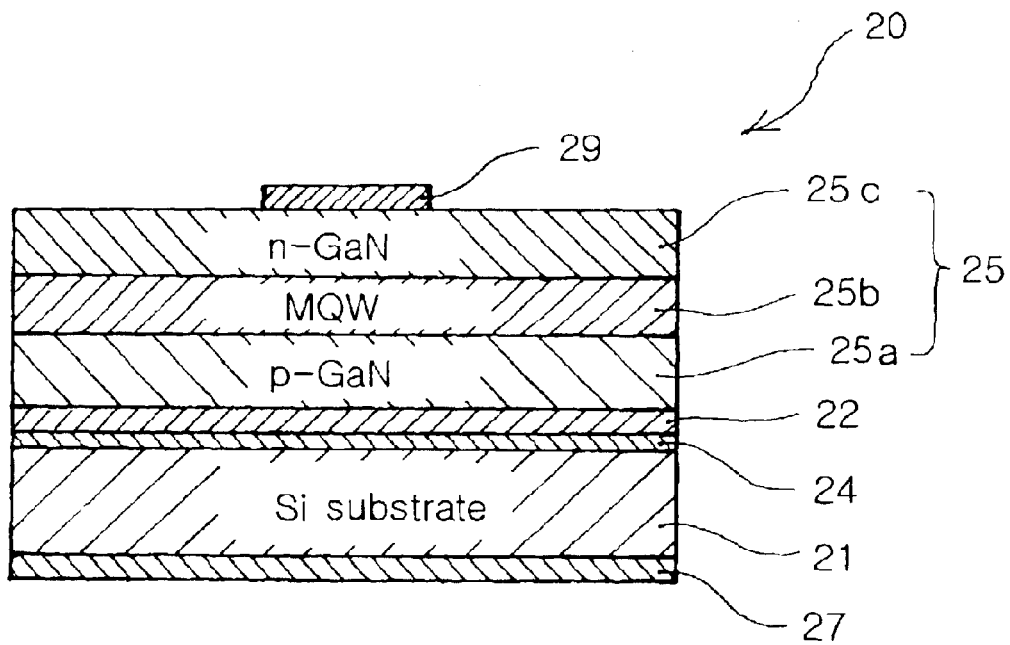
FIG. 2 is a schematic cross-sectional view of a vertical GaN light emitting diode manufactured in accordance with the present invention.

FIG. 2 is a cross-sectional view of a vertical GaN light emitting diode 20 manufactured in accordance with the present invention.

The vertical GaN light emitting diode 20 comprises a light emitting structure 25 including a p-type GaN clad layer 25a, an active layer 25b, and an n-type GaN clad layer 25c. Further, the GaN light emitting diode 20 selectively comprises a reflective layer 22 formed on the lower surface of the p-type GaN clad layer 25a. The reflective layer 22 is attached to a silicon substrate 21 using a conductive adhesive layer 24. The reflective layer 22 serves to improve the effective luminance depending on light emitted from the upper surface of the GaN light emitting diode 20, and is made of a metal with high reflectivity. Preferably, the reflective layer 22 is made of a material selected from the group consisting of Au, Ni, Ag, Al and their alloys.

That is, the conductive adhesive layer 24 is formed on the lower surface of the reflective layer 22. First, the GaN single crystalline light emitting structure 25 of the present invention is grown on a sapphire substrate, and a conductive substrate is attached to the other side of the light emitting structure 25. Then, the vertical GaN light emitting diode 20 shown in FIG. 2 is obtained by removing the sapphire substrate from the light emitting structure 25.

Here, the conductive adhesive layer 24 is used to attach the silicon substrate 21 to the light emitting structure 25. The conductive adhesive layer 24 used in the present invention must be made of a conductive material with an adhesive property. Preferably, such a conductive material is a metal adhesive selected from the group consisting of Au—Sn, Sn, In, Au—Ag, Ag—In, Ag—Ge, Ag—Cu, and Pb—Sn. As described above, the conductive adhesive layer 24 is made of a metal or an alloy, thus having comparatively high reflectivity. Accordingly, although the reflective layer 22 is omitted, the luminance of the GaN light emitting diode 20 of the present invention can be improved by the reflectivity of the conductive adhesive layer 24.

This embodiment employs the silicon substrate 21 as a conductive substrate. However, various conductive substrates rather than the insulating sapphire substrate may be used in the present invention. Here, the conductive substrate of the present invention may be made of silicon, germanium (Ge), Sic, ZnO, diamond, GaAs, etc.

The vertical GaN light emitting diode 20 of this embodiment is designed so that the upper and lower portions of the light emitting diode 20 are electrically connected to each other. A p-type contact 27 is formed on the entire lower surface of the silicon substrate 21, and an n-type contact 29 is formed on a portion of the upper surface of the n-type GaN clad layer 25c. Thereby, the vertical GaN light emitting diode shown in FIG. 2 is completely manufactured.

Compared to the vertical structure of the conventional GaN light emitting diode, the GaN light emitting diode 20 of this embodiment provides several advantages. First, since the GaN light emitting diode 20 of this embodiment uses the silicon substrate 21 instead of the sapphire substrate, the GaN light emitting diode 20 has improved heat emission efficiency, reduced forward voltage ($V_f$) by the current flowing over a broader area than the conventional vertical light emitting diode, and enhanced electrostatic discharge efficiency.

Further, in view of a manufacturing process, the GaN light emitting diode 20 of this embodiment has remarkably improved current density distribution, thus not requiring a step of forming a transparent electrode. Further, since the sapphire substrate is removed from the light emitting structure, a step of cutting the light emitting diode into a plurality of units can be simplified. Moreover, in view of the luminance of the light emitting diode, differently from the conventional vertical light emitting diode, the vertical light emitting diode of this embodiment does not require a step of selectively etching the active layer, thus obtaining a large-sized light emitting area and improved luminance.

Hereinafter, with reference to FIGS. 3a to 3f, a method for manufacturing vertical GaN light emitting diodes of the present invention is described in detail.

FIGS. 3a to 3f are cross-sectional views illustrating each step of the method for manufacturing vertical GaN light emitting diodes in accordance with a preferred embodiment of the present invention.

Figure 3:
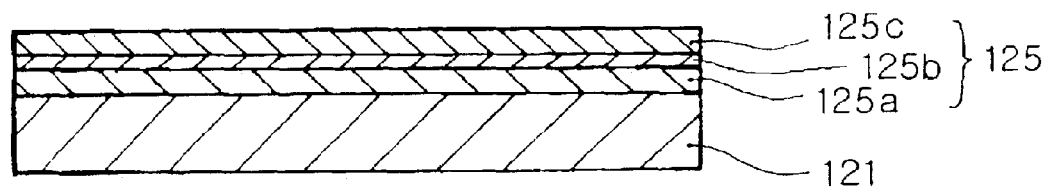
FIGS. 3a to 3f are cross-sectional views illustrating a method for manufacturing vertical GaN light emitting diodes in accordance with the present invention.
Figure 3:
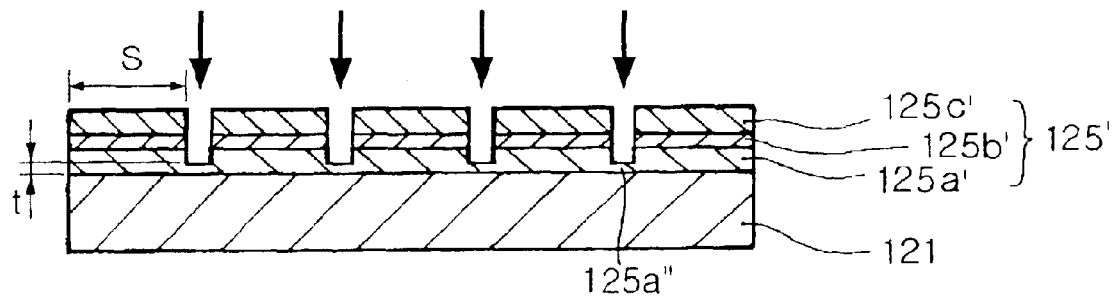
Figure 3:
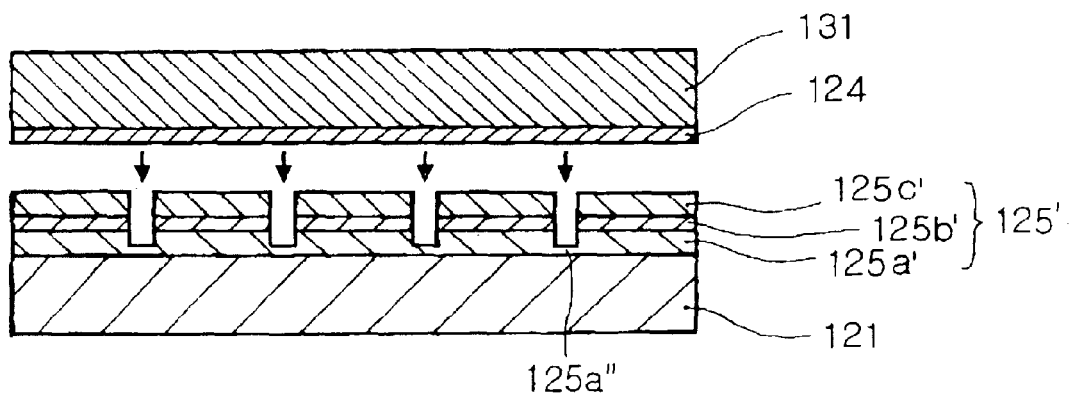
Figure 3:
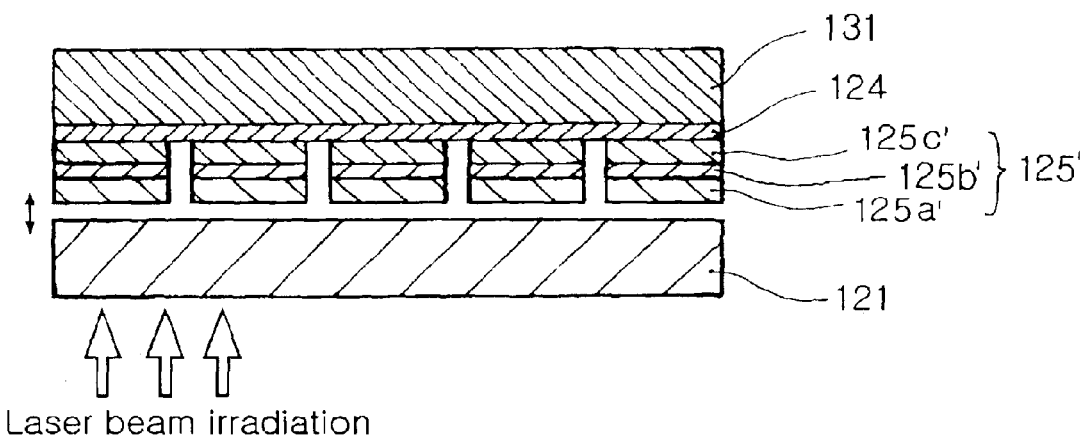
Figure 3:
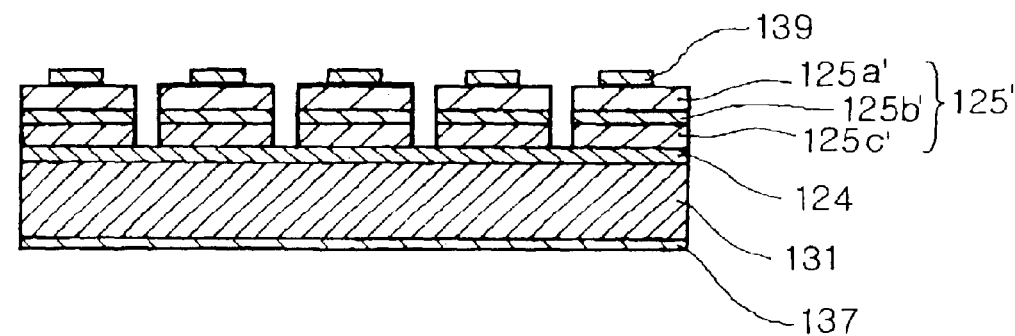
Figure 3:
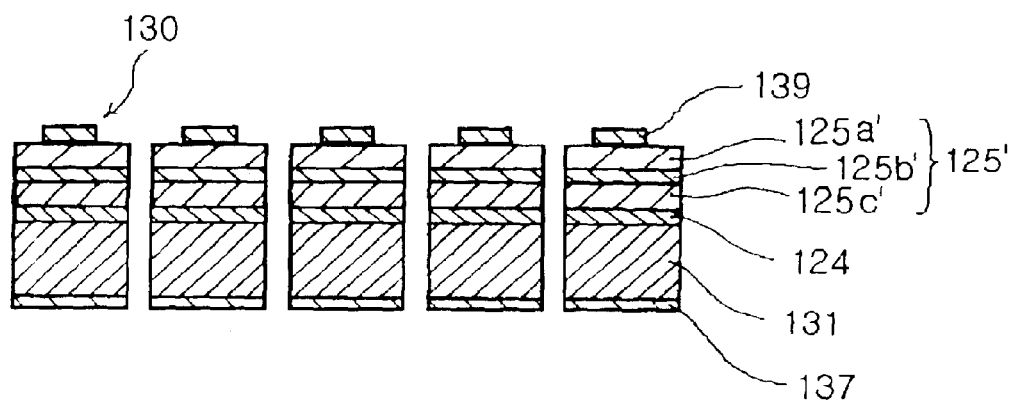

With reference to FIG. 3a, a light emitting structure 125 made of a GaN single crystalline layer is formed on a sapphire substrate 121. The GaN single crystalline layer of the light emitting diode 125 comprises an n-type GaN clad layer 125a, an active layer 125b, and a p-type GaN clad layer 125c. Although not shown in FIG. 3a, a reflective layer made of a material selected from the group consisting of Au, Ni, Ag, Al and their alloys may be additionally formed on the upper surface of the light emitting structure 125 so as to improve the reflective effect.

Subsequently, as shown in FIG. 3b, a first cutting step of the GaN light emitting structure 125 is preformed. Here, the GaN light emitting structure 125 is cut into a plurality of units with a designated size (S) so that the n-type GaN clad layer 125a of a thickness (t) of at least approximately 100 Å remains. In this first cutting step, in order to minimize the level of stress exerted on the unit light emitting structure by irradiating a laser beam thereon, the GaN light emitting structure 125 is cut so that the size (S) of each of the unit light emitting structures 125' corresponds to the size of a final light emitting diode to be manufactured. However, the GaN light emitting structure 125 is not perfectly cut so that the residual n-type GaN clad layer 125"a is of a thickness (t) of at least approximately 100 Å.

When a laser beam is irradiated on the rear surface of the sapphire substrate 121 so as to remove the sapphire substrate 121 from the unit light emitting structures 125' (shown in FIG. 3d), the residual n-type GaN clad layer 125"a serves as a cut-off layer for preventing the laser beam passing through the sapphire substrate 121 from affecting the unit light emitting structures 125'. The detailed description of this step will be given later.

Then, as shown in FIG. 3c, a conductive substrate 131 is attached to the upper surfaces of the first cut unit light emitting structures 125' using a conductive adhesive layer 124. This step may be achieved by forming the conductive adhesive layer 124 on the lower surface of the conductive substrate 131 and then attaching the other surface of the conductive adhesive layer 124 to the unit light emitting structures 125' (specifically, to the unit p-type GaN clad layers 125'c). Alternatively, this step may be achieved by forming the conductive adhesive layer 124 on an attaching surface of the conductive substrate 131 and attaching the conductive substrate 131 to the upper surfaces of the unit light emitting structures 125'. The conductive adhesive layer 124 is made of a material such as Au—Sn, Sn, In, Au—Ag, Ag—In, Ag—Ge, Ag—Cu, or Pb—Sn. The conductive adhesive layer 124 is made of a metal or alloy with comparatively high reflectivity, thus having a desired reflective effect without use of an additional reflective layer (22 of FIG. 2).

In this step, since the conductive substrate 131 is attached to the upper surfaces of the unit light emitting structures 125', which are imperfectly cut from the light emitting structure 125 shown in FIG. 3b, although the sapphire substrate 121 is separated from the unit light emitting structures 125', the unit light emitting structures 125' can be stably arranged and maintained. Accordingly, it is possible to easily perform a subsequent step such as the forming of contacts using a mask under the condition that the unit light emitting structures 125' are arranged.

As shown in FIG. 3d, a laser beam is irradiated on the lower surface of the sapphire substrate 121 so that the sapphire substrate 121 is removed from the imperfectly cut unit light emitting structures 125'. The laser beam passes through the sapphire substrate 121, divides the residual n-type GaN clad layer 125"a contacting the sapphire substrate 121 into gallium (Ga) and nitrogen (N$_2$), and then melts gallium (Ga) by heat of a designated temperature, thus easily removing the sapphire substrate 121 from the unit light emitting structures 125'.

The laser beam used in the step passes through the sapphire substrate 121, and then may melt the conductive adhesive layer 124. In case that the conductive adhesive layer 124 is melted by the laser beam, the adhesive force between the conductive substrate 131 and the unit light emitting structures 125' may be weakened, thereby causing the detachment of the conductive substrate 131 from the unit light emitting structures 125'. In order to prevent the laser beam passing through the sapphire substrate 121 from reaching the conductive adhesive layer 124, the light emitting, structure 125 is imperfectly cut into the unit light emitting structures 125' so that the residual n-type GaN clad layer 125"a is of a thickness (t) of at least approximately 100 Å. In order to cut off the laser beam passing through the sapphire substrate 121, the thickness (t) of the residual n-type GaN clad layer 125"a must be at least approximately 100 Å.

Since the thickness (t) of the residual n-type GaN clad layer 125"a disposed between the unit light emitting structures 125' is very small, the stress exerted on the interface between the sapphire substrate 121 and the residual n-type GaN clad layer 125"a is consumed for removing the residual n-type GaN clad layer 125"a. Accordingly, the actual stress acting on the interface between the sapphire substrate 121 and the unit light emitting structures 125' is exerted only on the small-sized (S) unit light emitting structures 125'. Thereby, it is possible to reduce the level of the stress acting on the unit light emitting structures 125'.

The residual n-type GaN clad layer 125"a is removed by mechanical polishing. At this time, the imperfectly cut unit light emitting structures 125' are perfectly cut into a plurality of light emitting diodes. That is, a self-dicing of the light emitting structures 125' is carried out.

In order to reduce the level of stress and obtain the self-dicing effect, the thickness (t) of the residual n-type GaN clad layer 125"a in FIG. 3a may be modified depending on the irradiation amount and time of the laser beam. Preferably, the thickness (t) of the residual n-type GaN clad layer 125"a is less than approximately 2 µm, and more preferably less than approximately 1µm.

As shown in FIG. 3e, a contact forming step is performed on both surfaces of the resulting structure. FIG. 3e shows the inverted state of the resulting structure of FIG. 3d. Here, contacts are formed only on the upper surfaces of the n-type GaN clad layer 125"a of the unit light emitting structures 125' and the lower surface of the conductive substrate 131. An n-type contact 139 is formed on a designated area of the upper surface of each n-type GaN clad layer 125"a (generally, the center of the upper surface), and a p-type contact 137 serving as a rear electrode is formed on the entire lower surface of the conductive substrate 131.

Finally, as shown in FIG. 3f, vertical GaN light emitting diodes 130 are obtained by perfectly cutting the resulting structure of FIG. 3e into plural units. Generally, a silicon substrate with strength smaller than that of the sapphire substrate 121 is used as the conductive substrate 131, thus being easily cut by a conventional cutting step.

As apparent from the above description, the present invention provides a method for manufacturing vertical GaN light emitting diodes with improved luminous efficiency, in which a sapphire substrate is easily removed from a light emitting structure using a laser beam and the melting of a conductive adhesive layer due to the exposure to the laser beam passing through the sapphire substrate is prevented.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing GaN light emitting diodes, comprising the steps of:
   (a) forming a light emitting structure on sapphire substrate, said light emitting structure includes a first conductive GaN clad layer, an active layer and a second conductive GaN layer sequentially stacked on the sapphire substrate;
   (b) partially cutting the light emitting structure into plural units with a designated size so that at least approximately 100 Å of the thickness of the first conductive GaN clad layer remains on the substrate;
   (c) attaching a conductive substrate to exposed upper surfaces of the unit light emitting structures using a conductive adhesive layer;
   (d) irradiating a laser beam on a lower surface of the sapphire substrate so that the sapphire substrate is removed from the unit light emitting structures, wherein the residual first conductive GaN clad layer is removed so that the light emitting structure can be perfectly divided into the unit light emitting structures with a size same as that of light emitting diodes to be finally manufactured;
   (e) forming first and second contacts respectively on the surface of the first conductive clad layer, from which the sapphire substrate is removed, and the exposed surface of the conductive substrate; and
   (f) cutting the resulting structure along the cut lines of the unit light emitting structures into plural unit light emitting diodes.

2. The method for manufacturing GaN light emitting diodes as set forth in claim 1,
   wherein in the step (b), the thickness of the residual first conductive GaN clad layer is less than approximately 2 µm.

3. The method for manufacturing GaN light emitting diodes as set forth in claim 1,
   wherein in the step (b), the thickness of the residual first conductive GaN clad layer is less than approximately 1 µm.

4. The method for manufacturing GaN light emitting diodes as set forth in claim 1,
   wherein the step (a) includes the step of forming a reflective layer made of a conductive material on the second conductive GaN clad layer.

5. The method for manufacturing GaN light emitting diodes as set forth in claim 4, wherein the reflective layer is made of a material selected from the group consisting of Au, Ni, Ag, Al and their alloys.

6. The method for manufacturing GaN light emitting diodes as set forth in claim 1, wherein the step (c) includes the sub-steps of:

(c-1) forming the conductive adhesive layer on the lower surface of the conductive substrate; and (c-2) attaching the lower surface of the conductive substrate provided with the conductive adhesive layer to the exposed upper surfaces of the unit light emitting structures.

7. The method for manufacturing GaN light emitting diodes as set forth in claim 1, wherein the step (c) includes the sub-steps of:

(c') forming the conductive adhesive layer on the upper surfaces of the unit light emitting structures; and (c") attaching the conductive substrate to the upper surfaces of the unit light emitting structures provided with the conductive adhesive layer.

8. The method for manufacturing GaN light emitting diodes as set forth in claim 1, wherein the conductive substrate is made of a material selected from the group consisting of silicon (Si), germanium (Ge), SiC, ZnO, diamond, and GaAs.

9. The method for manufacturing GaN light emitting diodes as set forth in claim 1, wherein the conductive adhesive layer is made of a material selected from the group consisting of Au—Sn, Sn, In, Au—Ag, Ag—In, Ag—Ge, Ag—Cu and Pb—Sn.

10. The method for manufacturing GaN light emitting diodes as set forth in claim 1, wherein the first conductive GaN clad layer is a GaN crystalline layer doped with an n-type impurity, and the second conductive GaN clad layer is a GaN crystalline layer doped with a p-type impurity.

* * * * *